United States Patent

[11] 3,627,585

[72] Inventors Alan Albert Dollery
Windlesham, Surrey;
Neville Stanley Reed, Farnham, Surrey;
Frederick Christopher Treble,
Farnborough, all of England

[21] Appl. No. 813,123
[22] Filed Apr. 3, 1969
[45] Patented Dec. 14, 1971
[73] Assignee Minister of Technology in Her Britannic Majesty's Government of the United Kingdom of Great Britain and Northern Ireland
London, England
[32] Priority Oct. 14, 1968
[33] Great Britain
[31] 48,483/68

[54] SOLAR CELL ARRAYS
6 Claims, 7 Drawing Figs.

[52] U.S. Cl. .......... 136/89, 244/15 S
[51] Int. Cl. .......... H01l
[50] Field of Search .......... 136/89

[56] References Cited

UNITED STATES PATENTS

| | | | |
|---|---|---|---|
| 3,222,225 | 12/1965 | Amiet et al. | 136/114 X |
| 3,346,419 | 10/1967 | Webb | 136/89 |
| 3,375,141 | 3/1968 | Julius | 136/89 |
| 3,376,164 | 4/1968 | Bachwansky | 136/89 |
| 3,419,434 | 12/1968 | Colehower | 136/89 |
| 3,459,391 | 8/1969 | Haynos | 136/89 X |
| 3,477,662 | 11/1969 | Anderson | 136/89 X |

*Primary Examiner*—Allen B. Curtis
*Attorney*—Cameron, Kerkam & Sutton

ABSTRACT: According to the present invention a stowable solar cell array includes solar cells mounted on a thin flexible substrate which is supported on an erectable frame, the frame and substrate being arranged so that in the stowed condition with the frame collapsed the substrate is held in flat concertinalike folds, and frame erection means whereby the frame is capable of being erected to unfold the substrate and support it in a fully deployed condition.

Figures 1, 2:
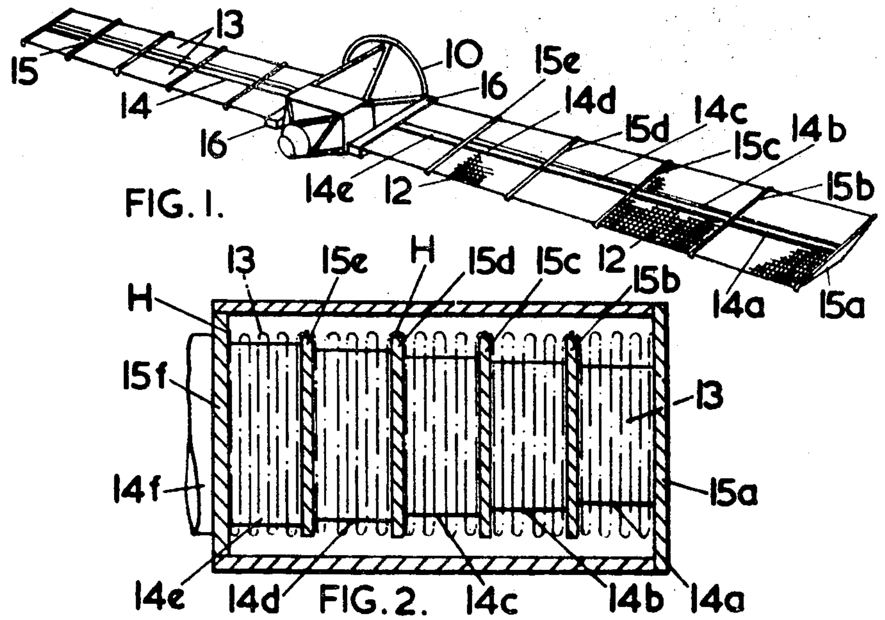

The erectable frame may include a telescopic tube having several sections slidably arranged one inside the other, and the frame erection means conveniently may be means for releasing a compressed gas into the interior of the telescopic tube to extend it and deploy the sections of the tube.

SOLAR CELL ARRAYS

This invention relates to large area solar cell arrays of the type used with spacecraft and satellites.

To meet increasing power requirements of future spacecraft, particularly those employing electric propulsion, there is a demand for large lightweight arrays of solar cells which can be stowed away into a small space for launching.

One approach to this problem is to mount thin solar cells on a thin flexible substrate which may then be stowed within the fairing of the spacecraft during launch and deployed to its operation state after separation and despinning. Provision also has to be made for the suitable protection of the solar cells during stowage, transit and deployment of the array.

A further difficulty in developing a lightweight array of this type is to devise a method of interconnecting the cells and attaching them to the substrate which will withstand the severe thermal cycling experienced by exposed spacecraft structures of low thermal capacity as they move into and out of the Earth's shadow. It has been calculated, for instance, that the temperature of the thin solar cell carrying paddles of a satellite in the geostationary orbit (36,000 km., circular, equatorial) would fall from a maximum of 55° C. in sunlight to about −180° C. at the end of the period of eclipse. To withstand repeated heating and cooling over this range, thermal mismatch must be minimized.

It is an object of this invention to provide an improved stowable lightweight large area solar cell array.

According to the present invention a stowable solar cell array includes solar cells mounted on a thin flexible substrate which is supported on an erectable frame, the frame and substrate being arranged so that in the stowed condition with the frame collapsed the substrate is held in flat concertinalike folds, and frame erection means whereby the frame is capable of being erected to unfold the substrate and support it in a fully deployed condition.

The erectable frame may include a telescopic tube having several sections slidably arranged one inside the other, and the frame erection means conveniently may be means for releasing a compressed gas into the interior of the telescopic tube to extend it and deploy the sections of the tube. The compressed gas may be contained within the inner section of the telescopic tube, which is sealed from the other sections by a release mechanism, which mechanism also holds the sections of the tube in the retracted condition but which, when actuated, forcibly initiates deployment of the inner section to break the seal and effect the release of the compressed gas from within the inner section to the chamber within the retracted tube whereafter the sections of the tube are successively deployed as the gas expands, each section being extended when the preceding section is fully extended.

The frame may also include rigid cross members to which the substrate is attached, each cross member being attached to a section of the telescopic tube whereby as the telescopic tube is extended adjacent cross members are moved apart longitudinally of the tube axis until, with the tube in the fully extended condition the substrate is stretched across the cross members in the fully deployed condition.

In a preferred arrangement the folds of the stowed substrate are interleaved with thin sheets of a protective material to protect the solar cells mounted on the substrate from possible damage caused by frettage and chafing. Layers of a cushioning material may also be included in the stowed pack to reduce uneven loading on the solar cells and to hold the solar cells steady against vibration. Conveniently such cushioning material may be provided on the cross members of the frame.

The stowed frame and substrate is preferably contained in a housing and means may be provided adjacent the sidewalls of the housing whereby the interleaving sheets of protective material may be assembled in position between the folds of the substrate as the substrate is being stowed, there also being means whereby the interleaving sheets are retained within the housing after full deployment of the frame and substrate from within the housing. The inner section of the telescopic tube conveniently may be connected to the lid of the housing which also constitutes the top cross member of the substrate support frame.

In a further aspect of the invention the solar cells, mounted at one side of the substrate, are electrically interconnected on the opposite side of the substrate by soldering the interconnections to the back of the cells through small holes in the substrate. The size of the holes controls the diameter of the solder joint. In this way the cells are not only electrically interconnected, but are also buttoned to the substrate by solder thus obviating the need for mounting cement.

To assist cooling when the array is operating in sunlight, a cutout may be provided in the substrate behind each cell; the back of each cell advantageously may be coated with a material of high thermal emissivity.

Figure 3:
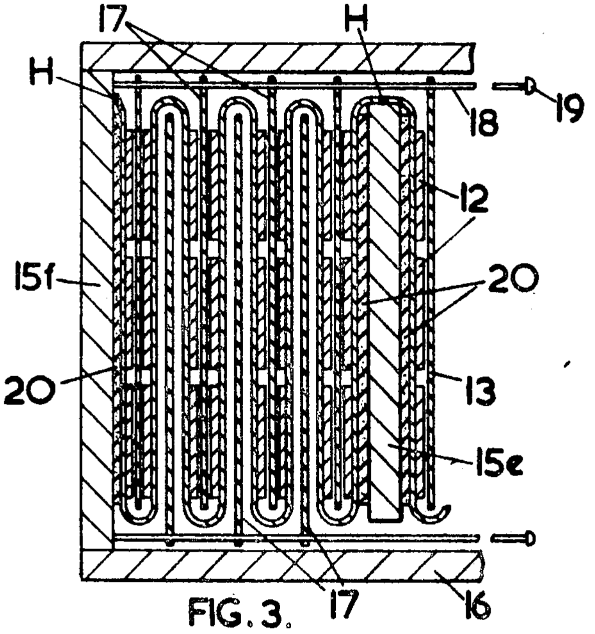
Figure 7:
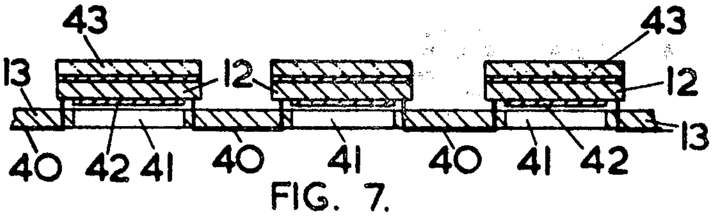
Figure 4:
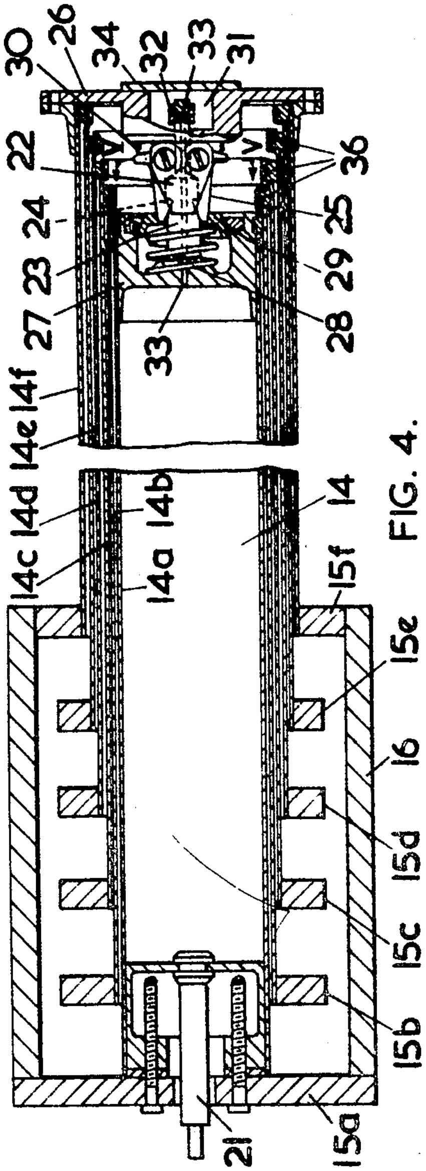
Figure 5:
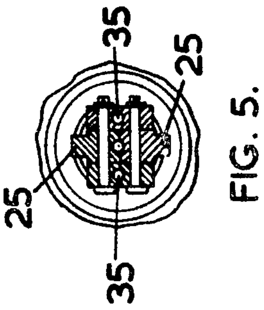
Figure 6:
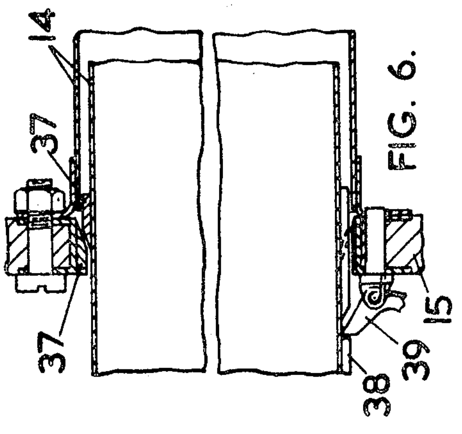

An embodiment of the invention will now be described by way of example only and with reference to the accompanying drawings of which:

FIG. 1 is an isometric view of a satellite with fully deployed solar cell array, FIG. 2 is a section through the solar cell array housing showing the stowed array in chain-dot line, FIG. 3 is a part of the section of FIG. 2, at a greatly enlarged vertical scale, showing the stowed solar array with protective interleaving, FIG. 4 is a longitudinal section similar to FIG. 2 along the axis of a telescopic tube showing the tube in the retracted condition, the solar cell array being omitted for clarity, FIG. 5 is a section on the line V—V of FIG. 4 showing pyrotechnic piston actuators, FIG. 6 is a detail view showing means for locking the tube in the fully extended condition, and FIG. 7 is a section through a substrate showing the method of mounting and connecting the solar cells to the substrate (vertical scale enlarged for clarity).

FIG. 1 shows a satellite 10 with two fully deployed solar cell array paddles 11, 11. Each paddle 11 is 4.20 m. long by 0.91 m. wide and includes two panels of thin silicon cells 12 mounted on a thin substrates 13, 13 of polyamide film and supported on a frame comprising a telescopic tube 14 and cross members 15.

Each telescopic tube 14 has six 1.00 m. long thin walled aluminum alloy sections **14*a*, *b*, *c*, *d*, *e* and *f*. (FIGS. 2 and 4) the innermost (radially) section 14*a* being of 3.50 cm. outside diameter and the outermost section 14*f* of 5.00 cm. outside diameter. Each of the sections 14*a* ... 14*f* has an aluminum honeycomb cross member 15*a* ... 15*f*, respectively, attached to its outer end. The substrates 13, 13 are attached to and supported by the cross members 15*a* ... 15*f***.

To facilitate handling the substrates 13, 13 are made in five individual lengths or sections (not shown) which are joined to each other and to the cross members **15*a* ... 15*f*** by hinge joints H. The joints H are in the form of simple piano-type hinges and comprise a series of spaced apart tubelike passageways formed along the edge regions of the individual sections, the passageways of one section being interspaced with respect to the passageways of an adjacent section so that a hinge pin can be threaded through them passing firstly through a passageway on one section and then through a passageway on the adjacent section and so on until the joint is completed.

The spaced apart tubelike passageways are made by folding the edge region of the individual section back on itself, sticking it to the unfolded region and then cutting away discrete lengths of the continuous elongated tube so formed.

The substrates 13, 13 are attached to the cross members **15*a* ... 15*f* by passing the hinge pins (not shown) through eyes (also not shown) on the cross members 15*a* ... 15*f*** during the construction of the joints H.

For launching, the telescopic tube 14 is in a retracted condition with the tubes **14*a* ... 14*f* nesting one within the other and the substrates 13, 13 are folded concertina-fashion and stowed in an aluminum honeycomb housing 16 (refer FIGS. 2 and 3). The cross member 15*a* on the innermost section 14*a*** forms the cover of the housing 16 and the cross member 15*f* on the outermost section 14*f* forms the base of the housing 16 (refer FIGS. 2 and 4).

The substrates 13, 13 fold up into a stack 6.35 cm. wide and the folds of the stack are interleaved with thin sheets of protective material 17 to protect the solar cells 12 and their connections (not shown) against frettage and chafing during stowage, deployment and launching. The leaves of protective material 17 are positioned within the housing 16 by small bore thin walled hollow pins 18 which are spaced at approximately 13.00 cm. pitch along the length of the housing 16 and locate with corresponding holes in the edge region of the leaves 17. The leaves 17 are threaded onto the pins 18 one by one as the substrates 13, 13 are stowed in their concertina folds. When the last leaf 17 has been assembled over the pins 18 capping pins 19 are inserted into the pins 18 and locked in position by crimping the tops of the pins 18.

Foam cushioning strips 20 are provided on the cross members 15*a* ... 15*f* to maintain a reasonably uniform pressure on the folded substrate 13 and cells 12 and to avoid uneven loads on the cells 12.

FIG. 4 shows a longitudinal section along the axis of one of the retracted telescopic tubes 14. The innermost section 14*a* has closed ends and a valve 21 at its outboard end through which it may be charged with a compressed gas, e.g., dry nitrogen, to a pressure of 2 to 3 atmospheres. A pyrotechnically operated release mechanism 22 connects the innermost section 14*a* and the outermost section 14*f* together and maintains the stowed assembly (i.e., substrates 13, 13, cells 12, tube 14 and cross members 15) under a load of about 180 kg. and restrains the retracted nest of tubes 14*a* ... 14*f* against centrifugal and acceleration forces during launch which together amount to about 40 g.

The release mechanism 22 includes a shaft 23 having opposed detents 24 which are gripped by claws 25 pivotally mounted on an end plate 26 attached to the outermost section 14*f*. The shaft 23 is part of a plug 27 which seals the inner end of the innermost section 14*a*. The plug 27 houses a compression spring 28 which holds a retaining washer 29 over the tips of the claws 25 to retain them in the gripping position where they locate with the detents 24 and hold the telescopic tube 14 in the retracted condition. Small springs 30 act to hold the claws 25 in contact with the detents 24 although the dimensions and shape of the detents 24 are such that an axial pull on the shaft 23 would override the springs 30 to open the claws 25 and release the shaft 23.

The end length of the shaft 23 extends into a chamber 31 in the end plate 26 and a rubber sleeve 32, also in the chamber 31, seals the end of a gas port 33 which communicates with the interior of the innermost tube section 14*a*.

A cover plate 34 is provided in the end plate 26 to facilitate assembly of the sleeve 32 and positioning of the retaining washer 29 over the claws 25.

Pyrotechnic piston actuators 35 (FIG. 5) are positioned with one end located in the end plate 26 and the other end just contacting the retaining washer 29 so that when actuated they force the washer 29 out of contact with the claws 25 to initiate the release sequence. The pyrotechnic actuators 35 are of the kind in which firing of the charge is initiated by fusing of wire within the charge, the wire receiving current from a battery carried on the satellite. The release of current from the battery may be programmed by a switch to take place when the satellite's rate of spin falls below a predetermined rate, say 20 revolutions per minute or may be commanded by a radio signal received by a radio receiver in the satellite. The initial expansion of the stowed assembly, together with forces exerted by the piston actuators 35 and the spring 28 pushes the plug 27 away from the end plate 26 and withdraws the end of the shaft 23 from within the chamber 31. In so doing the sleeve 32 is slid off the end of the shaft 23 to uncover the gas port 33 and allow the compressed gas to pass at a controlled rate from the inside of the innermost tube section 14*a* to the inside of the retracted nest of tube sections 14*b* ... 14*f* and initiate their deployment.

P.T.F.E. seals 36 on the outside of the tube sections 14*a* ... 14*e* impart a piston action during deployment, first to the innermost section 14*a* and then successively to 14*b* ... 14*e* as each preceding section becomes fully extended against conical stop cones 37 mounted on the tube sections 14*a* ... 14*e* and cross members 15*b* ... 15*f* respectively, as is shown in FIG. 6.

Keys 38 fitted externally along the length of each tube section 14*a* ... 14*e* engage with P.T.F.E. keyways (not shown) in the bore of the adjacent tube sections 14*b* ... 14*f* respectively to prevent rotation of the sections during deployment. The keys 38, keyways (not shown) and seals 36 also serve to keep the tube sections 14*a* ... 14*f* concentric.

Simple spring loaded pawls 39 on the cross members 15*b* ... 15*f* engage in serrations in the keys 38 to prevent telescopic collapse of the fully extended tube 14.

During deployment, which takes about 2 minutes, the substrates 13, 13 are drawn out from between the leaves 17 which deflect and are then retained captive within the housing 16.

A small air bleed (not shown) allows the pressurized assembly slowly to become fully depressurized over a period of about 30 minutes after deployment, the gas being released in such a way that it does not cause disturbing torques on the satellite 10.

The system of stowage and deployment described above has the following desirable features:

1. The gas operated telescopic tube 14 is very light method of deployment and support which is unlikely to be affected by the launch environment.

2. The system is simple and can be fully ground tested before launch.

3. The solar cells 12 are stowed flat and adequately supported during launch.

4. The release mechanism will function if either of the two pyrotechnic piston actuators 35 is fired.

5. The piston seals are only required to be effective for a few minutes in orbit when disturbing forces are at a minimum.

6. The design is such that an auxiliary compressed gas supply could be incorporated should it prove to be required.

The method of interconnecting and mounting the silicon cells 12 on the substrate 13 is of interest. Conventionally the cells 12 would be connected in the desired series/parallel configuration by soldering metal foil strips to contacts on the front and back surfaces, and then stuck to the substrates 13, 13 with a silicone elastomer or modified epoxy cement. This method of construction is not entirely satisfactory because of the thermal mismatches at the soldered joints and between the mounting cement and the silicon. The silicone cement hardens at −55° C. to −60° C. and thereafter has a much higher thermal coefficient of expansion than the other materials involved, with the result that, as it cools, it tends to pull off the soldered joints.

The solar cells 12 of the above described embodiment are attached to the substrate 13 by placing the interconnections on the other side of the substrate 13 to the cells 12 and soldering them to the backs of the cells 12 through small holes in the substrates 13, 13 which control the area of the joint. In this way the cells 12 are not only electrically interconnected together but are also buttoned to the substrate 13 thus obviating the need for mounting cement.

FIG. 7 shows this arrangement which embodies so-called "-wrap-round" solar cells 12 i.e., solar cells with both negative and positive contact on the back. The foil interconnections 40 are of Invar, a material whose coefficient of expansion is similar to that of silicon. The cells 12 are soldered directly to the interconnections 40 through holes in the substrate 13. Holes 1.00 mm. diameter have been found large enough to give adequate mechanical strength and small enough to avoid excessive differential thermal expansion stresses in the required thermal cycling tests. An aperture 41 is formed in the substrate 13 behind each cell 12 to assist cooling when the cells 12 are operating in sunlight; each cell 12 is backed with a coating of high thermally emissive material 42.

A cover slip 43 of glass or fused silica is cemented onto the face of each cell 12 to improve the thermal emissivity of the cell 12 and to protect it against low-energy radiation.

In an alternative arrangement (not shown) using solar cells with conventional contacts i.e., contacts on front and back surfaces the series connections are taken through holes in the substrate and soldered to the front contact strips. This does not permit such close control of the area of soldered joint as is possible with the preferred arrangement described above.

Besides being able to withstand severe thermal cycling the preferred arrangement shown in FIG. 7 has the following advantages over more conventional mounting techniques:

1. It is cheap to manufacture, compared with known methods, as the cells can be covered before assembly and all assembly operations can be performed on the back of the cells.

2. It is very easy to remove a damaged or faulty cell from an assembled array and replace it with a sound one.

3. The elimination of mounting cement reduces the overall weight. Although the embodiment described refers to silicon solar cells the invention could obviously be applied to any type of monocrystalline solar cell, e.g. gallium arsenide.

We claim:

1. A solar cell array comprising
- a thin flexible substrate,
- a plurality of solar cells supported at one face on said substrate,
- a frame, erectable from a collapsed to an erect position,
- cross members on said frame supporting said substrate,
- retaining means holding said frame in the collapsed position and with said substrate held in concertinalike folds,
- thin sheets of protective material interleaved between the folds of the folded substrate for protecting said solar cells against frettage and chafing,
- foam cushioning strips interleaved between at least some of said folds of said folded substrate,
- release means for releasing said retaining means, and
- erection means operative on release of said retaining means to erect the frame, the erection of the frame serving to unfold and to support the flexible substrate in a fully deployed condition when erection is complete.

2. A solar cell array as claimed in claim 1 wherein said frame includes at least one set of at least two telescopically nesting tubes and said erection means comprises a charge of compressed gas retained within said tubes, which gas upon release of said retaining means expands to extend the tubes telescopically from a telescopically collapsed condition to an erect position.

3. A solar cell array as claimed in claim 1 and having an electrical interconnecting network at the other face of the substrate, means defining perforations in said substrate at a location corresponding to each solar cell and solder connections joining each of said solar cells individually to said network at each of said perforations, respectively.

4. A solar cell according to claim 3 having means defining apertures in the substrate, one aperture at the rear of each solar cell and wherein each solar cell has a coating of material of high-thermal emissivity at its rear face adjacent the substrate.

5. A solar cell array according to claim 4 and wherein each solar cell has a cover slip at its front face.

6. A solar cell array comprising
- two erectable frames, each frame comprising at least two telescopically nesting tubes,
- a cross member carried on each tube,
- a thin flexible substrate supported on said cross members on each of said frames,
- a plurality of solar cells at the one face of each of said substrates,
- an electrical interconnecting network at the other face of each of said substrates,
- means defining perforations in said substrates at the location of each of said solar cells,
- solder connections joining each of said solar cells to said electrical network and extending through each of said perforations.
- a coating of material of high-thermal emissivity at the rear face of each solar cell adjacent said substrates,
- gastight end closures at both ends of each smallest diameter tube of each frame,
- a gas charging valve extending through said end closures at one end of said smallest diameter tubes,
- means defining a passage for gas extending through said remaining closures at the other end of said smallest diameter tubes, and connecting the interior of said smallest diameter tubes to the interior of the remaining tubes of each corresponding set,
- sealing means sealing said passages when the frame is in a collapsed position,
- gastight end closures at that end of the tubes of largest diameter remote from the charging valve of the corresponding set,
- retaining means operative between said end closures of the largest diameter tubes and the corresponding adjacent end closure of the smallest diameter tubes to hold said sets of tubes in a telescopically collapsed position with said substrates held in concertinalike folds and with gas charged under pressure through said charging valves retained in said smallest diameter tubes,
- thin sheets of protective material interleaved between the folds of the folded substrates for protecting said solar cells against frettage and chafing.

* * * * *